United States Patent
Inokuchi et al.

(10) Patent No.: US 8,847,288 B2
(45) Date of Patent: Sep. 30, 2014

(54) SPIN TRANSISTORS AND MEMORY

(71) Applicant: Kabushiki Kaisha Toshiba, Tokyo (JP)

(72) Inventors: Tomoaki Inokuchi, Yokohama (JP);
Mizue Ishikawa, Yokohama (JP);
Hideyuki Sugiyama, Kawasaki (JP);
Yoshiaki Saito, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/749,982

(22) Filed: Jan. 25, 2013

(65) Prior Publication Data
US 2013/0248941 A1 Sep. 26, 2013

(30) Foreign Application Priority Data
Mar. 26, 2012 (JP) ................................. 2012-070144

(51) Int. Cl.
*H01L 29/66* (2006.01)
*H01L 29/82* (2006.01)

(52) U.S. Cl.
CPC .......... *H01L 29/82* (2013.01); *H01L 29/66984* (2013.01)
USPC ........... 257/252; 257/246; 257/247; 257/421; 365/148; 365/171

(58) Field of Classification Search
USPC ........... 257/2–5, 421–427, 245–252; 365/365
See application file for complete search history.

(56) References Cited

U.S. PATENT DOCUMENTS

| | | | |
|---|---|---|---|
| 2007/0115716 A1* | 5/2007 | Saito et al. | 365/158 |
| 2008/0061332 A1* | 3/2008 | Saito et al. | 257/295 |
| 2009/0059659 A1* | 3/2009 | Inokuchi et al. | 365/171 |
| 2010/0072528 A1* | 3/2010 | Inokuchi et al. | 257/295 |

FOREIGN PATENT DOCUMENTS

| | | |
|---|---|---|
| JP | 4-370977 A | 12/1992 |
| JP | 5-175494 A | 7/1993 |
| JP | 2009-170556 A | 7/2009 |
| JP | 2010-080536 A | 4/2010 |
| JP | 2010-225885 A | 10/2010 |

OTHER PUBLICATIONS

Satoshi Sugahara et al. "A spin metal-oxide-semiconductor field-effect transistor using half-metallic-ferromagnet contacts for the source and drain", Applied physics Letters, 84 (2004)pp. 2307-2309.
Tomohiro Matsuno et al. "Novel Reconfigurable Logic Gates Using Spin Metal-Oxide-Semiconductor Field-Effect Transistors", Japanese Journal of Applied Physics, vol. 43, No. 9A 2004, pp. 6032-6037.

(Continued)

*Primary Examiner* — Matthew W Such
*Assistant Examiner* — Frederick B Hargrove
(74) *Attorney, Agent, or Firm* — Oblon, Spivak, McClelland, Maier & Neustadt, L.L.P.

(57) ABSTRACT

A spin transistor according to an embodiment includes: a semiconductor layer including a $p^+$-region and an $n^+$-region located at a distance from each other, and an i-region located between the $p^+$-region and the $n^+$-region; a first electrode located on the $p^+$-region, the first electrode including a first ferromagnetic layer; a second electrode located on the $n^+$-region, the second electrode including a second ferromagnetic layer; and a gate located on at least the i-region.

20 Claims, 5 Drawing Sheets

(56) References Cited

OTHER PUBLICATIONS

Gerhard H. Fecher et al. "Substituting the main group element in cobalt-iron based Heusler alloys: $Co_2FeAl_{1-x}Si_x$", Journal of Physics D:40 (2007), pp. 1582-1586.

Benjamin Balke et al. "Properties of the quaternary half-metal-type Heusler alloy $CO_2Mn_{1-x}Fe_xSi$", Physical Review B 74 104405 (2006) pp. 1-10.

Japanese Office Action issued May 30, 2014 in Japanese Patent Application No. 2012-070144 with English Translation.

* cited by examiner

SPIN TRANSISTORS AND MEMORY

CROSS-REFERENCE TO RELATED APPLICATION

This application is based upon and claims the benefit of priority from prior Japanese Patent Application No. 2012-70144 filed on Mar. 26, 2012 in Japan, the entire contents of which are incorporated herein by reference.

FIELD

Embodiments described herein relate generally to spin transistors and a memory.

BACKGROUND

In recent years, novel devices that utilize the charges of electrons and the nature of spins at the same time have been actively studied. In a spin transistor that is one of such novel devices, a magnetic material is used as a source electrode and a drain electrode, and output characteristics can be controlled by changing the relative magnetization directions of the source electrode and the drain electrode. That is, this control is performed by taking advantage of the fact that the drain current ($I_D^P$) increases when the relative magnetization directions of the source electrode and the drain electrode are substantially parallel, and the drain current ($I_D^{AP}$) decreases when the relative magnetization directions are substantially antiparallel. When a spin transistor is used in a memory or a reconfigurable logic circuit, the $I_D^P/I_D^{AP}$ ratio or the drain current difference between a substantially parallel magnetization state and a substantially antiparallel magnetization state needs to be increased. To increase the $I_D^P/I_D^{AP}$ ratio, the spin polarization rate of the magnetic material used as the source electrode and the drain electrode needs to be increased. However, even if a magnetic material with a spin polarization rate of 100% is used, the $I_D^P/I_D^{AP}$ ratio becomes lower when a finite bias is applied between the source electrode and the drain electrode. Also, the characteristics indicating the current equal to or lower than the threshold value (the subthreshold swing value (the S value)) cannot become lower than 60 mV/decade in theory, which hinders a power consumption reduction in the circuit.

As described above, when a finite bias is applied between the source electrode and the drain electrode, the $I_D^P/I_D^{AP}$ ratio of the spin transistor becomes lower, and the S value cannot become lower than 60 mV/decade.

DETAILED DESCRIPTION

A spin transistor according to an embodiment includes: a semiconductor layer including a $p^+$-region and an $n^+$-region located at a distance from each other, and an i-region located between the $p^+$-region and the $n^+$-region; a first electrode located on the $p^+$-region, the first electrode including a first ferromagnetic layer; a second electrode located on the $n^+$-region, the second electrode including a second ferromagnetic layer; and a gate located on at least the i-region.

The following is a description of embodiments, with reference to the accompanying drawings.

First Embodiment

Figure 1:
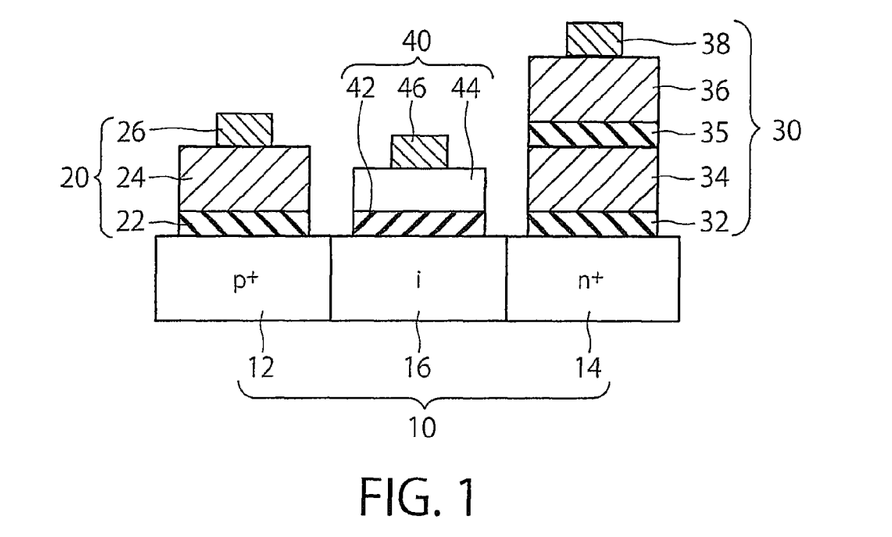
FIG. 1 is a cross-sectional view of a spin transistor according to a first embodiment.

FIG. 1 shows a spin transistor according to a first embodiment. FIG. 1 is a cross-sectional view of the structure of the spin transistor of this embodiment.

The spin transistor 1 of this embodiment is formed on a semiconductor layer 10 that includes a $p^+$-region 12 and an $n^+$-region 14 formed at a distance from each other, and an i (intrinsic)-region 16 provided between the $p^+$-region 12 and the $n^+$-region 14. That is, the $p^+$-region 12, the i-region 16, and the $n^+$-region 14 are formed in the semiconductor layer 10. The $p^+$-region 12 preferably has a p-type impurity concentration of $1\times10^{19}$ cm$^{-3}$ or higher, but may have a p-type impurity concentration lower than that. Likewise, the $n^+$-region preferably has an n-type impurity concentration of $1\times10^{19}$ cm$^{-3}$ or higher, but may have an n-type impurity concentration lower than that. A first electrode 20 including a ferromagnetic layer is provided on the semiconductor $p^+$-region 12, and a second electrode 30 including ferromagnetic layers is provided on the $n^+$-region 14. A gate 40 is provided on the i-region 16. The gate 40 may be provided on the i-region 16 and a part of the $n^+$-region 14. The gate 40 may be provided on the i-region 16 and a part of the $p^+$-region 12. The gate 40 may be provided on the i-region 16, a part of the $n^+$-region 14, and a part of the $p^+$-region 12. The semiconductor layer 10 may be a semiconductor substrate, or may be a SOI (Silicon On Insulator) layer.

The first electrode 20 includes a tunnel barrier layer 22 provided on the $p^+$-region 12, a ferromagnetic layer 24 that is provided on the tunnel barrier layer 22 and has fixed magnetization, and an electrode layer 26 provided on the ferromagnetic layer 24. The second electrode 30 includes a tunnel barrier layer 32 provided on the $n^+$-region 14, a ferromagnetic layer 34 that is provided on the tunnel barrier layer 32 and has variable magnetization, a nonmagnetic layer 35 provided on the ferromagnetic layer 34, a ferromagnetic layer 36 that is provided on the nonmagnetic layer 35 and has fixed magnetization, and an electrode layer 38 provided on the ferromagnetic layer 36. The gate 40 includes a gate insulating film 42 provided on the i-region 16, a gate electrode 44 provided on the gate insulating film 42, and an electrode layer 46 provided on the gate electrode 44. The electrode layers 26, 38, and 46 also serve as protection layers. The magnetization of the ferromagnetic layer 24 being fixed means that the magnetization direction of the ferromagnetic layer 24 does not vary before and after a write current is flowed between the first electrode 20 and the second electrode 30 via the i-region 16. The magnetization of the ferromagnetic layer 34 being variable means that the magnetization direction of the ferromagnetic layer 34 varies before and after a write current is flowed between the first electrode 20 and the second electrode 30 via the i-region 16. The magnetization directions of the ferromagnetic layer 24 and the ferromagnetic layer 36 are substantially antiparallel to each other. In this specification, the magnetization directions being substantially antiparallel to each other means that the angle θ formed by the relative magnetization directions of the ferromagnetic layer 24 and the ferromagnetic layer 36 is 150°<θ<210°. The magnetization directions being substantially parallel to each other means that the angle θ formed by the relative magnetization directions is −30°<θ<30°.

Figure 2:
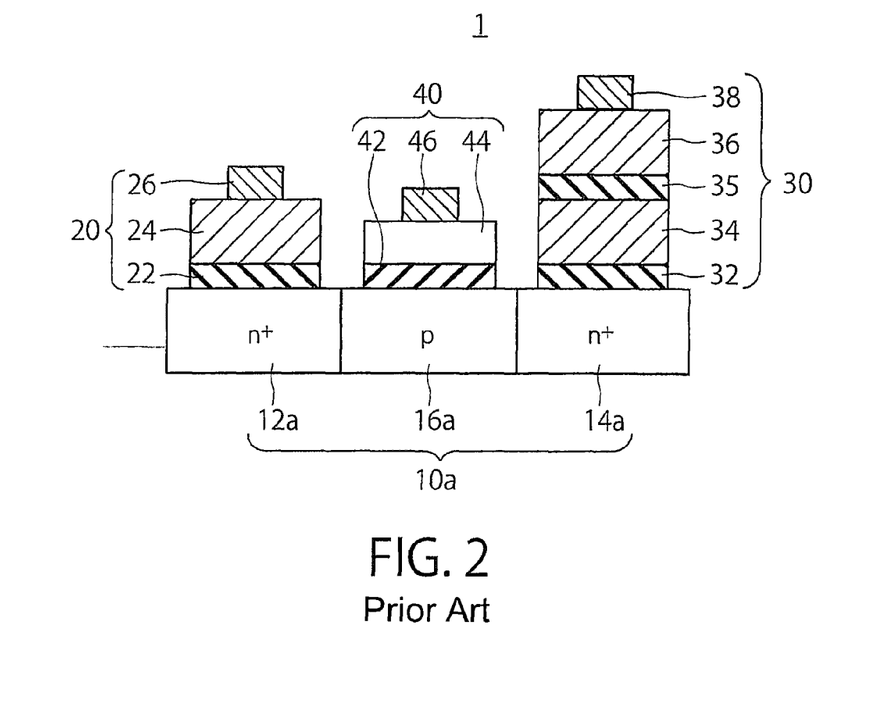
FIG. 2 is a cross-sectional view of a spin transistor of a comparative example.

As shown in FIG. 2, a spin transistor of a comparative example (a conventional spin transistor) is formed on a semiconductor layer 10a that includes an n$^+$-region 12a and an n$^+$-region 14a formed at a distance from each other, and a p-region 16a provided between the n$^+$-region 12a and the n$^+$-region 14a. A first electrode 20 is provided on the n$^+$-region 12a, and a second electrode 30 is provided on the n$^+$-region 14a. A gate 40 is provided on the p-region 16a.

In the spin transistor of this comparative example, the characteristics indicating the current equal to or lower than the threshold value (the subthreshold swing value (S value)) cannot be lower than 60 mV/decade in theory. Not only the supply voltage of the circuit cannot be lowered, but also the power consumption cannot be easily reduced.

In the spin transistor 1 of this embodiment, on the other hand, the width of the depletion layer of the i-region 16 becomes smaller upon application of a gate voltage, and interband tunneling is caused between the p$^+$-region 12 and the i-region 16. As a result, a current flows between the ferromagnetic layer 24 and the ferromagnetic layer 34. In a case where this structure is used, the S value can be 60 mV/decade or lower in theory. Accordingly, the supply voltage of the circuit can be made lower, and the power consumption can be made smaller.

In the spin transistor of this embodiment, the current generated when a voltage is applied between the electrode layer 26 and the electrode layer 38 depends on the voltage applied to the electrode layer 46, and on the relative magnetization directions of the ferromagnetic layer 24 and the ferromagnetic layer 34. That is, upon application of a gate voltage, a large current ($I_D^P$) flows if the relative magnetization directions of the ferromagnetic layer 24 and the ferromagnetic layer 34 are substantially parallel, and a small current ($I_D^{AP}$) flows if the relative magnetization directions are substantially antiparallel. By changing the structures and materials of the semiconductor (the p$^+$-region 12, the i-region 16, and the n$^+$-region 14) and the ferromagnetic layer, the small current ($I_D^P$) can be made to flow when the relative magnetization directions of the ferromagnetic layer 24 and the ferromagnetic layer 34 are substantially parallel, and the current to flow when the relative magnetization directions are substantially antiparallel ($I_D^{AP}$) can be made smaller. The higher the ratio (the $I_D^P/I_D^{AP}$ ratio) between the current in the case of the substantially parallel magnetization directions and the current in the case of the substantially antiparallel magnetization directions, the higher the performance of the spin transistor. The $I_D^P/I_D^{AP}$ ratio depends on the spin polarization rate of the ferromagnetic layers, the efficiency of the spin injection from the ferromagnetic layers into the channel, and the spin relaxation in the channel. Also, when the bias voltage applied between the electrode layer 26 and the electrode layer 38 is varied, the $I_D^P/I_D^{AP}$ ratio is also varied.

The reason that the $I_D^P/I_D^{AP}$ ratio varies upon application of the bias voltage in this embodiment is described below. In this embodiment, an example case where electrons are injected from the side of the first electrode 20 into the semiconductor layer 10 is described.

Figure 3:
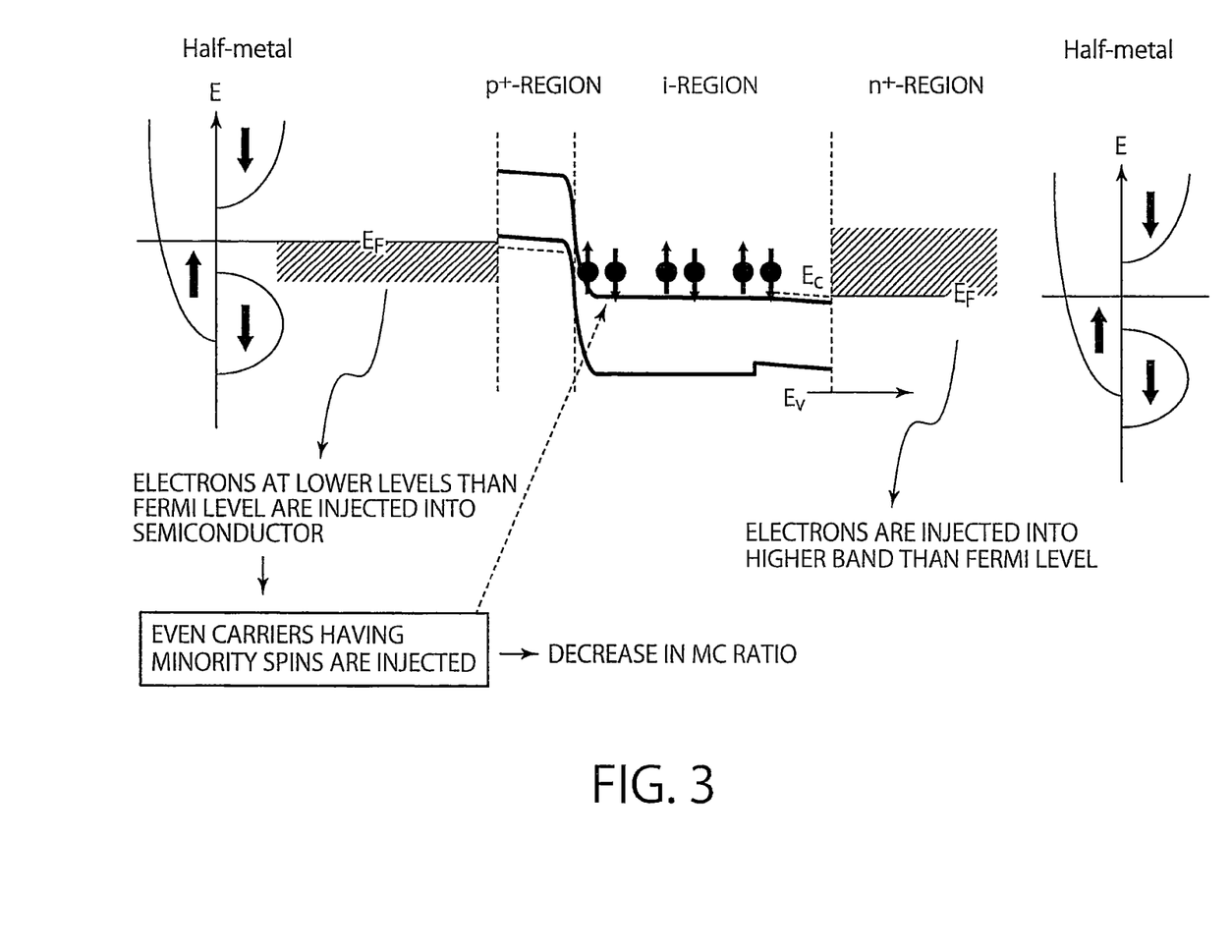
FIG. 3 is a diagram for explaining the problems of spin transistors.

When electrons are injected from the first electrode 20 into the p$^+$-region 12 via the tunnel barrier layer 22, the electrons existing in the lower energy levels than the Fermi level are injected into the p$^+$-region 12, as shown in FIG. 3, and therefore, the electrons existing in the lower energy levels than the Fermi level can also contribute to conduction. If the voltage applied between the ferromagnetic layer 24 and the ferromagnetic layer 34 is made gradually higher, the electrons in the minority spin band are also injected into the semiconductor layer 10 (the p$^+$-region 12, the i-region 16, and the n$^+$-region 14), and the spin polarization rate of the electrons injected into the semiconductor layer 10 becomes lower. As the spin polarization rate of the electrons injected into the semiconductor layer 10 becomes lower, the $I_D^P/I_D^{AP}$ ratio becomes lower. For the above reason, the $I_D^P/I_D^P$ ratio becomes lower upon application of finite bias.

Figure 4:
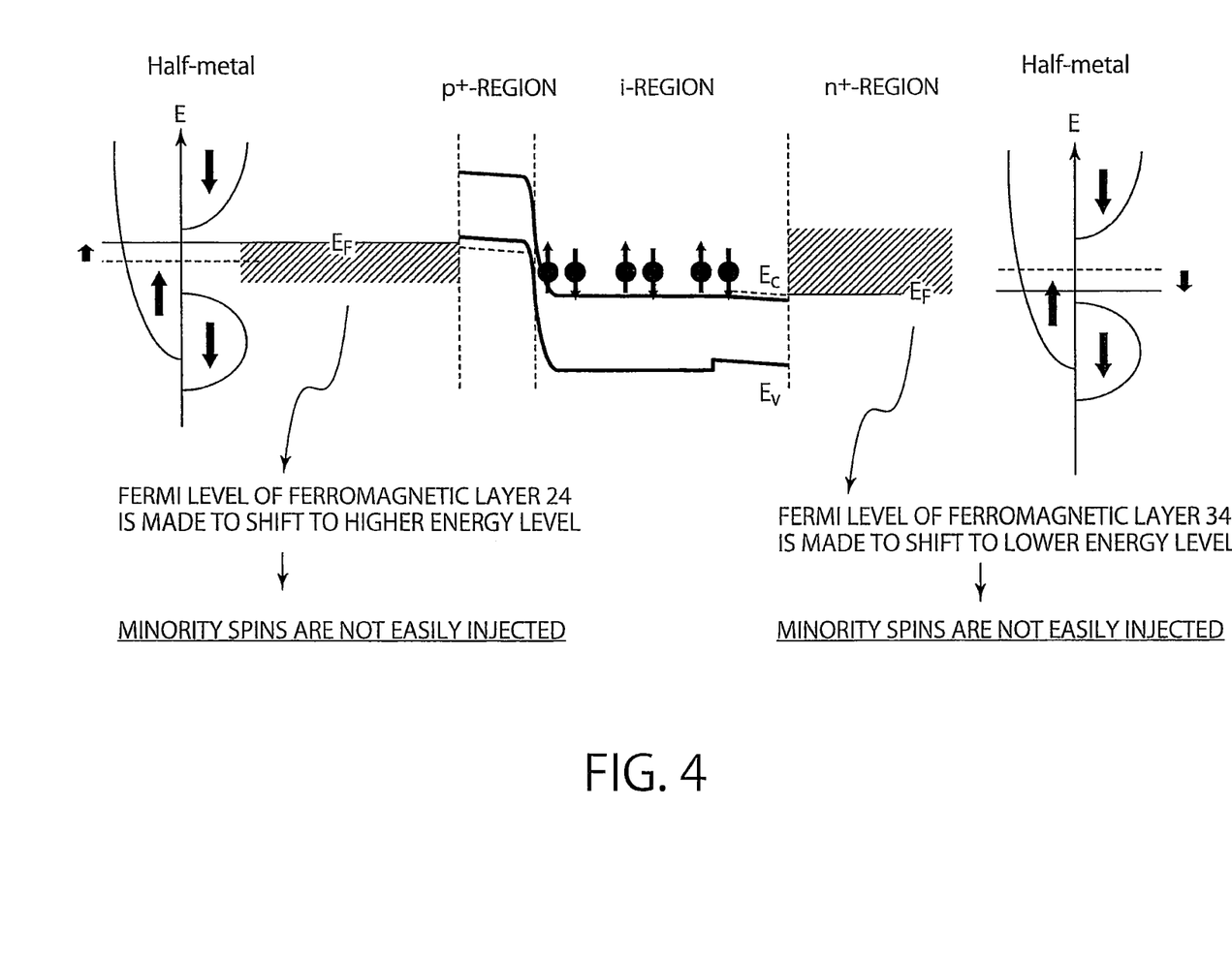
FIG. 4 is a diagram for explaining operations of spin transistors according to the first and second embodiments.

In view of this, to reduce the decrease in the $I_D^P/I_D^{AP}$ ratio caused by the bias application, a magnetic material having its Fermi level adjusted to a higher level than the center of the minority spin band gap is used as the ferromagnetic layer 24 in this embodiment, as shown in FIG. 4. Where this magnetic material is used as the ferromagnetic layer 24, the electrons in the minority spin band cannot contribute to conduction even at a relatively high bias voltage. Accordingly, decreases in the spin polarization rate of the electrons injected into the semiconductor layer can be prevented, and as a result, the decrease in the $I_D^P/I_D^{AP}$ ratio can be reduced.

Next, specific methods of adjusting the Fermi level of the ferromagnetic layer 24 are described. In a case where a half metal $Co_2FeAl_{1-x}Si_x$ (0<x<1) is used as the ferromagnetic layer 24, for example, a material having a higher composition ratio x than 0.5 is used, so that the Fermi level can be adjusted to a higher level than the center of the minority spin band gap (see G. H. Fecher and C. Felser, 3. Phys., D 40. 1582 (2007), for example).

In a case where a half metal $Co_2Mn_{1-x}Fe_xSi$ (0<x<1) is used as the ferromagnetic layer 24, a material having a higher composition ratio x than 0.5 is used, so that the Fermi level can be adjusted to a higher level than the center of the minority spin band gap (see B. Balke et. al., Phys. Rev. B 74, 104405 (2006), for example).

Even in a case where the magnetic material used as the ferromagnetic layer 24 is not completely a half metal, the decrease in the $I_D^P/I_D^{AP}$ ratio caused by the bias application can be reduced by using a magnetic material having its Fermi level adjusted to a lower level than the center of the energy region where the state density of the minority spin band is low.

Next, a write method for the spin transistor of this embodiment is described. By this write method, a write current is flowed between the electrode layers 26 and 38, to reverse the magnetization direction of the ferromagnetic layer 34.

First, a case where the magnetization direction of the ferromagnetic layer 24 and the magnetization direction of the ferromagnetic layer 34 that are substantially antiparallel directions are changed to substantially parallel directions is described. In this case, a voltage is applied to the gate electrode 44 via the electrode layer 46, to put the spin transistor into an ON state. A current is then flowed from the electrode layer 38 to the electrode layer 26. At this point, electrons flow from the electrode layer 26 to the ferromagnetic layer 24, the tunnel barrier layer 22, the p$^+$-region 12, the i-region 16, the n$^+$-region 14, the tunnel barrier layer 32, the ferromagnetic layer 34, the nonmagnetic layer 35, the ferromagnetic layer 36, and the electrode layer 38, in this order. The electrons flowing from the electrode layer 26 into the ferromagnetic layer 24 are spin-polarized, and flow into the ferromagnetic layer 34 via the p$^+$-region 12, the i-region 16, the n$^+$-region 14, and the tunnel barrier layer 32. The electrons having spins in the same direction as the ferromagnetic layer 34 (substantially antiparallel to the magnetization direction of the ferromagnetic layer 24) pass through the ferromagnetic layer 34. However, the electrons having spins in the opposite direction from the ferromagnetic layer 34 (substantially parallel to the magnetization direction of the ferromagnetic layer 24) apply spin toque to the electrons in the ferromagnetic layer 34, and act to reverse the magnetization of the ferromagnetic layer 34. Meanwhile, the electrons that have passed through the ferromagnetic layer 34 and have spins in the opposite direction from the ferromagnetic layer 34 are reflected by the interface between the nonmagnetic layer 35 and the ferromagnetic layer 36, and flow into the ferromagnetic layer 34. The reflected electrons then apply spin torque to the electrons in the ferromagnetic layer 34, and act to reverse the magnetization of the ferromagnetic layer 34. That is, the spin torque to reverse the magnetization of the ferromagnetic layer 34 twice act on the ferromagnetic layer 34, and the magnetization of the ferromagnetic layer 34 is reversed from the substantially antiparallel state to a substantially parallel state.

Next, a case where the magnetization direction of the ferromagnetic layer 24 and the magnetization direction of the ferromagnetic layer 34 that are substantially parallel directions are changed to substantially antiparallel directions is described. In this case, a voltage is applied to the gate electrode 44 via the electrode layer 46, to put the spin transistor into an ON state. A current is then applied from the electrode layer 26 to the electrode layer 38. At this point, electrons flow from the electrode layer 38 to the ferromagnetic layer 36, the nonmagnetic layer 35, the ferromagnetic layer 34, the tunnel barrier layer 32, the n$^+$-region 14, the i-region 16, the p$^+$-region 12, the tunnel barrier layer 22, the ferromagnetic layer 24, and the electrode layer 26, in this order. The electrons flowing from the electrode layer 38 into the ferromagnetic layer 36 are spin-polarized, and flow into the ferromagnetic layer 34 via the nonmagnetic layer 35. The electrons having spins in the same direction as the ferromagnetic layer 34 (substantially antiparallel to the magnetization direction of the ferromagnetic layer 38) pass through the ferromagnetic layer 34. However, the electrons having spins in the opposite direction from the ferromagnetic layer 34 (substantially parallel to the magnetization direction of the ferromagnetic layer 38) apply spin toque to the electrons in the ferromagnetic layer 34, and act to reverse the magnetization of the ferromagnetic layer 34. Meanwhile, the electrons that have passed through the ferromagnetic layer 34 and have spins in the opposite direction from the ferromagnetic layer 34 flow through the tunnel barrier layer 32, the n$^+$-region 14, the i-region 16, the p$^+$-region 12, and the tunnel barrier layer 22. The electrons are then reflected by the interface between the tunnel barrier layer 22 and the ferromagnetic layer 24, and flow into the ferromagnetic layer 34 via the p$^+$-region 12, the i-region 16, the n$^+$-region 14, and the tunnel barrier layer 32. The reflected electrons then apply spin torque to the electrons in the ferromagnetic layer 34, and act to reverse the magnetization of the ferromagnetic layer 34. That is, the spin torque to reverse the magnetization of the ferromagnetic layer 34 twice act on the ferromagnetic layer 34, and the magnetization of the ferromagnetic layer 34 is reversed from the substantially parallel state to a substantially antiparallel state.

In this manner, the magnetization direction of the ferromagnetic layer 34 can be changed, and the magnetization direction of the ferromagnetic layer 34 is nonvolatile. Accordingly, the spin transistor of this embodiment functions as a storage element of a nonvolatile memory.

Next, a method of manufacturing the spin transistor illustrated in FIG. 1 is described. First, impurities are injected into the semiconductor layer 10, and annealing is performed. As a result, the p$^+$-region 12, the i-region 16, and the n$^+$-region 14 are formed. After that, the gate insulating film 42 and the gate electrode 44 are formed.

After a tunnel barrier layer and a ferromagnetic layer are formed, the stacked structure formed with the tunnel barrier layer 22 and the ferromagnetic layer 24 is formed on the p$^+$-region 12, and the stacked structure formed with the tunnel barrier layer 32 and the ferromagnetic layer 34 is formed on the n$^+$-region 14, by using a lithography process and an etching process.

A mask (not shown) formed with a photoresist, for example, is then formed on the p$^+$-region 12 and the i-region 16, and the nonmagnetic layer 35 and the ferromagnetic layer 36 are sequentially stacked. The mask is then removed. After that, patterning is performed on the stacked structure formed with the tunnel barrier layer 22 and the ferromagnetic layer 24, and patterning is performed on the stacked structure formed with the tunnel barrier layer 32, the ferromagnetic layer 34, the nonmagnetic layer 35, and the ferromagnetic layer 36. The electrode layer 26 is formed on the ferromagnetic layer 24, the electrode layer 38 is formed on the ferromagnetic layer 36, and the electrode layer 46 is formed on the gate electrode 44.

Lastly, to give magnetic anisotropy to the ferromagnetic layer 24, the ferromagnetic layer 34, and the ferromagnetic layer 36, annealing is performed at 270° C. for one hour in a uniform magnetic field of 1 T.

The tunnel barrier layers 22 and 32 may not be provided. However, the tunnel barrier layers 22 and 32 are inserted into the interfaces between the semiconductor layer 10 and the ferromagnetic layers 24 and 34 as in this embodiment, so that spin injection efficiency can become higher, and transistor performance can be improved.

As described above, the first embodiment can provide a spin transistor that has an S value of 60 mV/decade or lower, and can reduce the decrease in the $I_D^P/I_D^P$ ratio caused by application of a finite bias. Accordingly, a spin transistor that can reduce power consumption and has excellent output characteristics can be obtained.

Second Embodiment

A spin transistor according to a second embodiment is now described. The second embodiment concerns the second electrode 30.

When electrons are injected from the semiconductor layer 10 into the ferromagnetic layer 34 via the tunnel barrier layer 32, the electrons existing in higher energy levels than the Fermi level are injected into the ferromagnetic layer 34, and the electrons existing in the higher energy levels than the Fermi level can also contribute to conduction, as shown in FIG. 3. Therefore, as the voltage applied between the ferromagnetic layer 24 and the ferromagnetic layer 34 is made gradually higher, those electrons can contribute to conduction not only in the majority spin band of the magnetic material but also in the minority spin band. In such a circumstance, the selectivity of majority spins and minority spins in the magnetic layer 34 becomes lower, and the $I_D^P/I_D^{AP}$ ratio becomes lower accordingly. For that reason, the $I_D^P/I_D^{AP}$ ratio becomes lower upon application of a finite bias.

In view of this, to reduce the decrease in the $I_D^P/I_D^{AP}$ ratio caused by the bias application, a magnetic material having its Fermi level adjusted to a lower level than the center of the minority spin band gap is used as the ferromagnetic layer 34 in this embodiment, as shown in FIG. 4. Where this magnetic material is used as the ferromagnetic layer 34, the electrons in the minority spin band cannot contribute to conduction even at a relatively high bias voltage. Accordingly, the decrease in the selectivity of majority spins and minority spins at the magnetic electrode can be prevented, and as a result, the decrease in the $I_D^P/I_D^{AP}$ ratio can be reduced.

Next, specific methods of adjusting the Fermi level of the ferromagnetic layer 34 are described. In a case where a half metal $Co_2FeAl_{1-x}Si_x$ is used as the ferromagnetic layer 34, for example, a material having a lower composition ratio x than 0.5 is used, so that the Fermi level can be adjusted to a lower level than the center of the minority spin band gap (G. H. Fecher and C. Felser, J. Phys., D 40. 1582 (2007)).

In a case where a half metal $Co_2Mn_{1-x}Fe_xSi$ is used as the ferromagnetic layer 34, a material having a lower composition ratio x than 0.5 is used, so that the Fermi level can be adjusted to a lower level than the center of the minority spin band gap (B. Balke et. al., J. Phys., D 40. 1582 (2007)).

Even in a case where the magnetic material used as the ferromagnetic layer 34 is not completely a half metal, the decrease in the $I_D^P/I_D^{AP}$ ratio caused by the bias application can be reduced by using a magnetic material having its Fermi level adjusted to a lower level than the center of the energy region where the state density of the minority spin band is low.

As described above, the second embodiment can provide a spin transistor that has an S value of 60 mV/decade or lower, and can reduce the decrease in the $I_D^P/I_D^{AP}$ ratio caused by application of a finite bias. Accordingly, a spin transistor that can reduce power consumption and has excellent output characteristics can be obtained.

Third Embodiment

A spin transistor according to a third embodiment is now described. As shown in FIG. 1, the spin transistor of the third embodiment is formed on a semiconductor layer 10 that includes a $p^+$-region 12 and an $n^+$-region 14 formed at a distance from each other, and an i (intrinsic)-region 16 provided between the $p^+$-region 12 and the $n^+$-region 14. A first electrode 20 including a ferromagnetic layer is provided on the semiconductor $p^+$-region 12, and a second electrode 30 including ferromagnetic layers is provided on the $n^+$-region 14. A gate 40 is provided on the i-region 16. In this embodiment, a semiconductor having the valence band maximum near the Γ point (such as Si, Ge, GaAs, or InGaAs) is used as the semiconductor of the $p^+$-region 12, and a semiconductor having the conduction band minimum near the Γ point (such as GaAs or InGaAs) is used as the semiconductor of the $n^+$-region 14. In the present specification, "near the Γ point" or "vicinity of the Γ point" means a range of ±Brillouin zone/2 centering around the Γ point. Layers (such as MgO layers) epitaxially formed on the semiconductor layer 10 are used as tunnel barrier layers 22 and 32 formed between the semiconductor layer 10 and ferromagnetic layers 24 and 34.

In the spin transistor of this embodiment, a high $I_D^P/I_D^{AP}$ ratio can be realized. The reason for this is described below.

First, the passing probability of the majority spin electrons flowing from the ferromagnetic layer 24 and passing through the tunnel barrier layer 22 become higher near the Γ point. The passing probability of the minority spin electrons becomes higher at a point other than the Γ point. When electrons are injected from the ferromagnetic layer 24 into the $p^+$-region 12, the electrons are injected into the valence band of the $p^+$-region 12. Therefore, when a semiconductor having the valence band maximum near the Γ point is used as the $p^+$-region 12, only the minority spins can be selectively allowed to pass, and the spin polarization rate of electrons can be effectively made higher.

In a case where electrons flow from the $n^+$-region 14 into the ferromagnetic layer 34, the electrons existing near the conduction band minimum of the $n^+$-region 14 contribute to conduction. Therefore, when a semiconductor having the conduction band minimum near the Γ point is used as the $n^+$-region 14 as in this embodiment, only the majority spin electrons can be selectively allowed to pass. Accordingly, a higher spin polarization rate can be effectively realized, and a high $I_D^P/I_D^{AP}$ ratio can be realized.

As described above, the third embodiment can provide a spin transistor that has an S value of 60 mV/decade or lower, and can reduce the decrease in the $I_D^P/I_D^{AP}$ ratio caused by application of a finite bias. Accordingly, a spin transistor that can reduce power consumption and has excellent output characteristics can be obtained.

Figure 5:
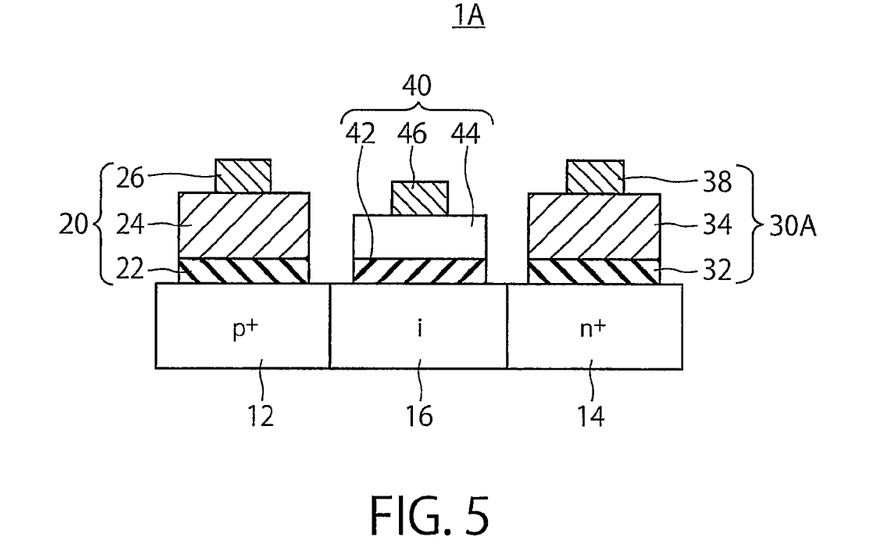
FIG. 5 is a cross-sectional view of a spin transistor according to a first modification of any of the first through third embodiments.

The same effects as above can also be achieved with a spin transistor 1A of a first modification in which the second electrode 30 is replaced with a second electrode 30A in any of the spin transistors of the first through third embodiments, as shown in FIG. 5. The second electrode 30A is the same as the second electrode 30 shown in FIG. 1, except that the nonmagnetic layer 35 and the ferromagnetic layer 36 are deleted.

Figure 6:
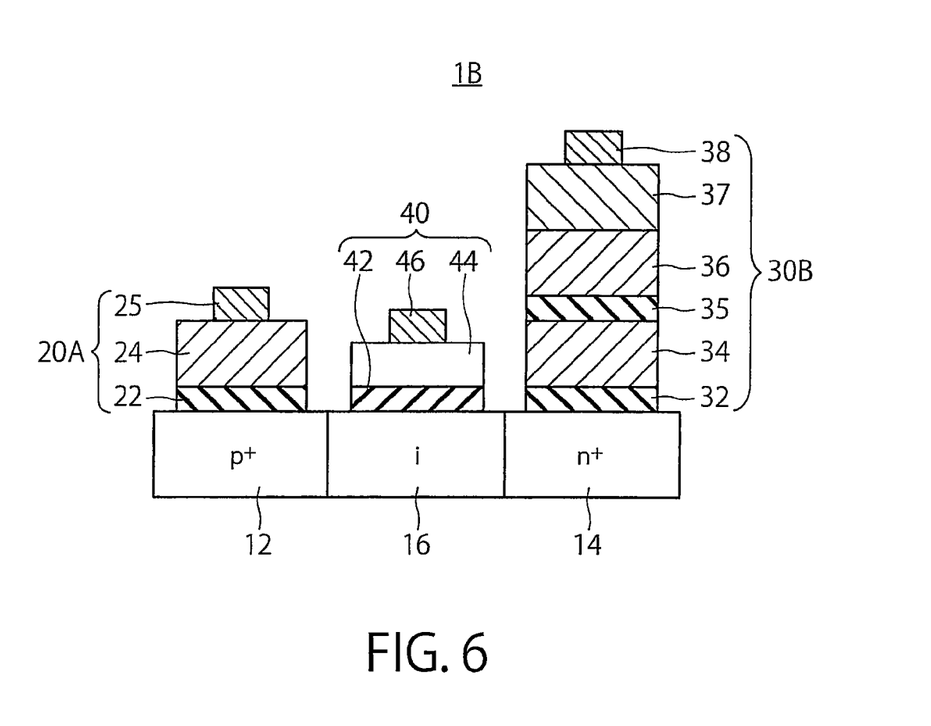
FIG. 6 is a cross-sectional view of a spin transistor according to a second modification of any of the first through third embodiments.

The same effects as above can also be achieved with a spin transistor 1B of a second modification in which the first electrode 20 and the second electrode 30 are replaced with a first electrode 20A and a second electrode 30B in any of the spin transistors of the first through third embodiments, as shown in FIG. 6. The first electrode 20A has an antiferromagnetic layer 25 formed on the ferromagnetic layer 24. The antiferromagnetic layer 25 pins the magnetization of the ferromagnetic layer 24. The second electrode 30B has an antiferromagnetic layer 37 on the ferromagnetic layer 36. The antiferromagnetic layer 37 pins the magnetization of the ferromagnetic layer 36. In this case, the magnetization directions of the ferromagnetic layers 24 and 36 are parallel to the film planes. Here, a film plane means the upper surface of a ferromagnetic layer. Alternatively, an antiferromagnetic layer may be provided only on the ferromagnetic layer 24 of the first electrode or on the ferromagnetic layer 36 of the second electrode.

In the first and second embodiments, and the modifications thereof, the same effects as above can be achieved even if the magnetization directions of the ferromagnetic layers 24, 34, and 36 are perpendicular to the film planes. In that case, a material having perpendicular magnetic anisotropy is used as the ferromagnetic layers 24, 34, and 36, and antiferromagnetic layers may not be provided.

Fourth Embodiment

Figure 7:
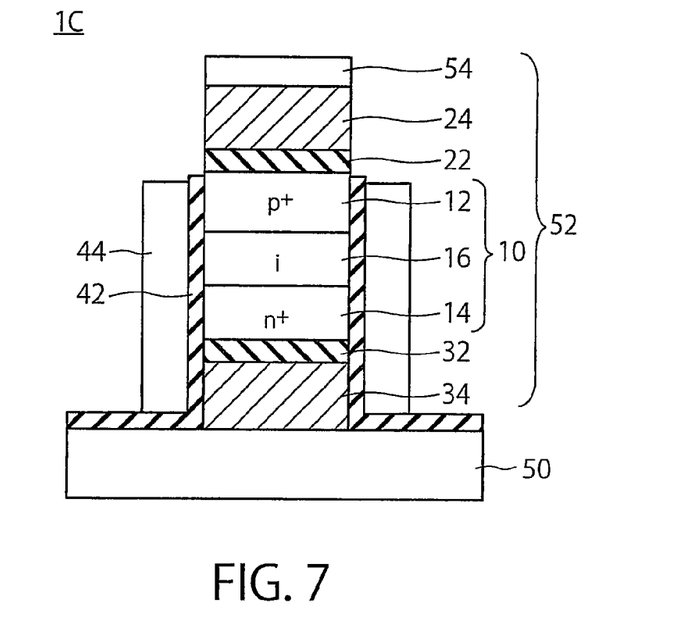
FIG. 7 is a cross-sectional view of a spin transistor according to a fourth embodiment.

FIG. 7 shows a spin transistor according to a fourth embodiment. The spin transistor 1C of the fourth embodiment is a vertical spin transistor, and has a film stack 52 on a lower electrode 50. The film stack 52 is formed by stacking a ferromagnetic layer 34, a tunnel barrier layer 32, an $n^+$-layer 14, an i-layer 16, a $p^+$-layer 12, a tunnel barrier layer 22, and a ferromagnetic layer 24, in this order. A gate insulating film 42 is provided on the side surfaces of the film stack 52, to cover at least the side surfaces of the i-layer 16, and a gate electrode 44 is provided on the opposite side of the gate insulating film 42 from the side surfaces of the film stack 52. An upper electrode 54 is formed on the ferromagnetic layer 24. The stacking order in the film stack 52 may be reversed. That is, the ferromagnetic layer 24, the tunnel barrier layer 22, the p$^+$-layer 12, the i-layer 16, the n$^+$-layer 14, the tunnel barrier layer 32, and the ferromagnetic layer 34 may be stacked in this order on the lower electrode 50. The gate electrode 44 and the lower electrode 50 are electrically insulated from each other by the gate insulating film 42. The insulation may be provided by using some other insulating film, instead of the gate insulating film 42.

As in the first through third embodiments, the magnetization of the ferromagnetic layer 24 is fixed, and the magnetization of the ferromagnetic layer 34 is variable. Also, as in the first embodiment or the second embodiment, as the ferromagnetic layer 24, a magnetic material having its Fermi level adjusted to a higher level than the center of the minority spin band gap is used, or as the ferromagnetic layer 34, a magnetic material having its Fermi level adjusted to a lower level than the center of the minority spin band gap is used.

Also, as in the third embodiment, a semiconductor having the valence band maximum near the Γ point (such as Si, Ge, GaAs, or InGaAs) may be used as the semiconductor of the p$^+$-layer 12, and a semiconductor having the conduction band minimum near the Γ point (such as GaAs or InGaAs) may be used as the semiconductor of the n$^+$-layer 14. At this point, layers (such as MgO layers) epitaxially formed on the semiconductor layer 10 are used as the tunnel barrier layers 22 and 32 formed between the semiconductor layer 10 and ferromagnetic layers 24 and 34.

Like the first through third embodiments, the fourth embodiment can also provide a spin transistor that has an S value of 60 mV/decade or lower, and can reduce the decrease in the $I_D^P/I_D^{AP}$ ratio caused by application of a finite bias. Accordingly, a spin transistor that can reduce power consumption and has excellent output characteristics can be obtained.

In the above described first through fourth embodiments, the following materials can be used.

(Semiconductor Layer)

First, in the above described embodiments, an n-type or p-type silicon substrate can be used as the semiconductor layer 10. It is also possible to use Ge, $Si_xGe_{1-x}$ (0<x<1), a III-V or II-VI compound semiconductor, SGOI (SiGe-On-Insulator), III-VOI (III-V-On-Insulator), a magnetic semiconductor, or the like.

(Ferromagnetic Layers)

Each of the ferromagnetic layers 24, 34, and 36 preferably has unidirectional anisotropy. The film thickness of each of those ferromagnetic layers is preferably 0.1 nm to 100 nm. Further, each of those electrodes needs to have such a thickness as not to be superparamagnetic, and more preferably, has a thickness of 0.4 nm or greater. The material of those ferromagnetic layers is a Heusler alloy such as $Co_2FeAl_{1-x}Si_x$ or $Co_2Mn_{1-x}Fe_xSi$.

Where X represents Fe, Co, Ni, Cu, Zn, Ru, Rh, Pd, Ag, Cd, Ir, Pt, or Au, Y represents Ti, V, Cr, Mn, or Fe, and Z represents Al, Ga, Si, Ge, or Sn, a Heusler alloy expressed as $X_2YZ$ has its Fermi level at the center of the minority spin band gap.

Therefore, if an element in $X_2YZ$ is substituted by an element having a larger number of electrons (particularly, valence electrons) than that in the element in $X_2YZ$, the position of the Fermi level shifts to a higher energy level than the center of the minority spin band gap.

If an element in $X_2YZ$ is substituted by an element having a smaller number of electrons (particularly, valence electrons) than that in the element in $X_2YZ$, the position of the Fermi level shifts to a lower energy level than the center of the minority spin band gap.

In this manner, the position of the Fermi level of a Heusler alloy can be adjusted.

It is also possible to use a magnetic material selected from the group consisting of Co, Fe, Ni, alloys of Co, Fe, or Ni, such as Co—Pt, Co—Fe—Pt, Fe—Pt, Co—Fe—Cr—Pt, Co—Cr—Pt, NiMnSb, $Co_2MnGe$, $Co_2MnAl$, $Co_2MnSi$, and CoCrFeAl, and magnetic semiconductors such as GeMn, SiCNi, SiCMn, SiCFe, ZnMnTe, ZnCrTe, BeMnTe, ZnVO, ZnMnO, ZnCoO, GaMnAs, InMnAs, InMnAb, GaMnP, GaMnN, GaCrN, AlCrN, BiFeTe, SbVTe, PbSnMnTe, GeMnTe, CdMnGeP, ZnSiNMn, ZnGeSiNMn, BeTiFeO, CdMnTe, ZnMnS, TiCoO, SiMn, and SiGeMn. Magnetic characteristics can be adjusted, and various physical properties such as crystallinity, mechanical properties, chemical properties can be adjusted, by adding a nonmagnetic element such as Ag (silver), Cu (copper), Au (gold), Al (aluminum), Ru (ruthenium), Os (osmium), Re (rhenium), Ta (tantalum), B (boron), C (carbon), O (oxygen), N (nitrogen), Pd (palladium), Pt (platinum), Zr (zirconium), Ir (iridium), W (tungsten), Mo (molybdenum), or Nb (niobium) to the above described magnetic materials.

(Antiferromagnetic Layers)

As for the antiferromagnetic layers, it is possible to use Fe—Mn (iron-manganese), Pt—Mn (platinum-manganese), Pt—Cr—Mn (platinum-chromium-manganese), Ni—Mn (nickel-manganese), Ir—Mn (iridium-manganese), NiO (nickel oxide), $Fe_2O_3$ (iron oxide), or the like.

(Tunnel Barrier Layers)

As for the tunnel barrier layers, it is possible to use an oxide or nitride of Si, Ge, Al, Ga, Mg, Ti, or the like, or SrTiO, NdGaO, or the like.

(Nonmagnetic Layer)

As for the nonmagnetic layer, it is possible to use a material containing at least one element selected from Cu, Cr, Au, Ag, Hf, Zr, Rh, Pt, Ir, and Al, an alloy of those materials, an oxide or nitride of Si, Ge, Al, Ga, Mg, Ti, or the like, SrTiO, NdGaO, $Si_xGe_{1-x}$ (0<x<1), a III-V or II-VI compound semiconductor, or a magnetic semiconductor.

In each of the above described first through fourth embodiments, the width of the depletion layer in the i-region becomes smaller upon application of a gate voltage, and interband tunneling occurs. As a result, the spin transistor is put into an ON state. However, as the field intensity between the source and the drain becomes higher, avalanche multiplication occurs, and therefore, the $I_D^P/I_D^{AP}$ ratio becomes lower. The reason for this is as follows.

When avalanche multiplication occurs, an electron with +½ spin is injected from the p$^+$-region into the i-region. As two electrons are generated, one hole flows from the i-region into the p$^+$-region. At this point, the angular momentum of the two electrons and the one hole is +½, according to the law of conservation of angular momentum. That is, the spin polarization rate of carriers is in effect lowered, and the $I_D^P/I_D^{AP}$ ratio of the spin transistor becomes lower. Therefore, at such a field intensity as to cause avalanche multiplication, the spin MOS characteristics in general are degraded.

In the spin transistor shown in FIG. 1 or 7, such a field intensity in the i-region as not to cause avalanche multiplication varies with the semiconductor material forming the i-region. In a case where the i-region is formed with Si, for example, the above field intensity is lower than $3 \times 10^5$ V/cm. In a case where the i-region is formed with GaAs, the above field intensity is lower than $3 \times 10^4$ V/cm. Therefore, in each of the spin transistors of the first through fourth embodiments, the field intensity in the i-region is preferably adjusted so as not to cause avalanche multiplication.

Fifth Embodiment

Figure 8:
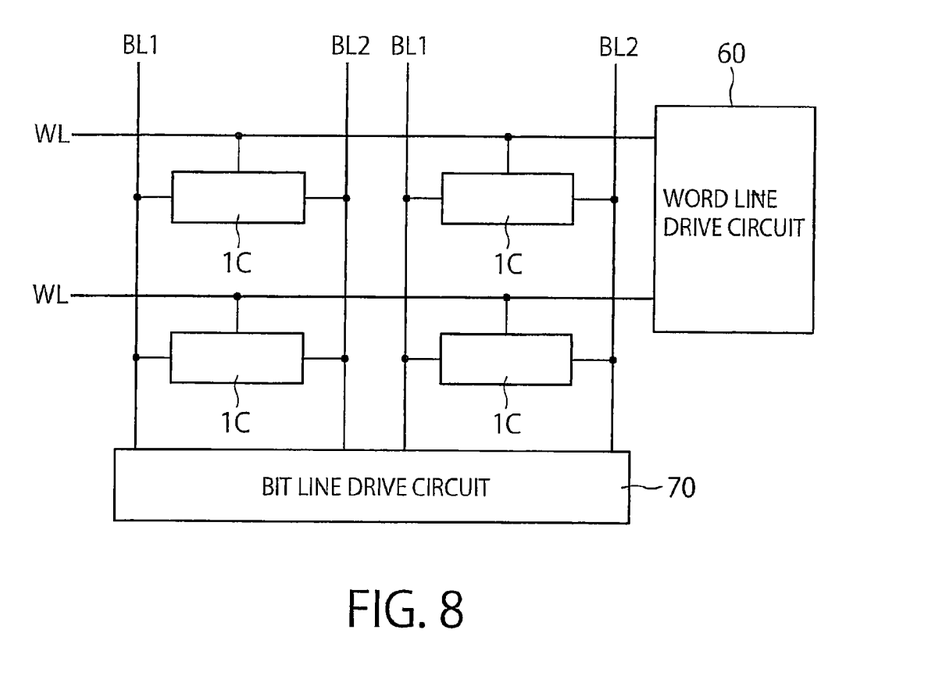
FIG. 8 is a circuit diagram of a memory according to a fifth embodiment.

Referring now to FIG. 8, a memory according to a fifth embodiment is described. FIG. 8 is a circuit diagram of the memory according to the fifth embodiment. In the memory of the fifth embodiment, spin transistors according to one of the first through fourth embodiments are arranged as storage elements of memory cells in a matrix fashion. FIG. 8 illustrates an example case where spin transistors 1C of the fourth embodiment are used as memory cells.

The gate electrodes of the spin transistors 1C in the same row are connected to a word line WL. One of the lower electrode 50 and the upper electrode 54 of each of the spin transistors 1C in the same column is connected to a bit line BL1, and the other one of the electrodes is connected to a bit line BL2.

At the time of writing, a word line WL is selected by a word line drive circuit 60, and the target spin transistor 1C that has the gate electrode connected to the selected word line WL is put into an ON state. The bit line BL1 and the bit line BL2 connected to the target spin transistor 1C are then selected by a bit line drive circuit 70. A write current is applied between the bit line BL1 and the bit line BL2, to perform writing on the spin transistor 1C.

At the time of reading, a word line WL is selected by the word line drive circuit 60, and the target spin transistor 1C that has the gate electrode connected to the selected word line WL is put into an ON state. The bit line BL1 and the bit line BL2 connected to the target spin transistor 1C are then selected by the bit line drive circuit 70. A read current is applied between the bit line BL1 and the bit line BL2, to read out data from the spin transistor 1C.

The memory according to the fifth embodiment has an S value of 60 mV/decade or smaller, and can reduce the decrease in the $I_D^P/I_D^{AP}$ ratio caused by application of a finite bias. Accordingly, a memory that can reduce power consumption and has excellent output characteristics can be obtained.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A spin transistor comprising:
a semiconductor layer including a $p^+$-region and an $n^+$-region located at a distance from each other, and an i-region located between the $p^+$-region and the $n^+$-region;
a first electrode located on the $p^+$-region, the first electrode including a first ferromagnetic layer;
a second electrode located on the $n^+$-region, the second electrode including a second ferromagnetic layer; and
a gate located on at least the i-region.

2. The transistor according to claim 1, wherein the first ferromagnetic layer has a Fermi level at a higher energy level than a center of a minority spin band gap.

3. The transistor according to claim 1, wherein the second ferromagnetic layer has a Fermi level at a lower energy level than a center of a minority spin band gap.

4. The transistor according to claim 1, wherein the $p^+$-region includes a semiconductor having a valence band maximum in the vicinity of a $\Gamma$ point.

5. The transistor according to claim 1, wherein the $n^+$-region includes a semiconductor having a conduction band minimum in the vicinity of a $\Gamma$ point.

6. The transistor according to claim 1, wherein, when the i-region is made of Si, a field intensity in the i-region is lower than $3\times10^5$ V/cm, and, when the i-region is made of GaAs, the field intensity in the i-region is lower than $3\times10^4$ V/cm.

7. The transistor according to claim 1, further comprising a tunnel barrier layer provided at least one of between the first ferromagnetic layer and the $p^+$-region, and between the second ferromagnetic layer and the $n^+$-region.

8. The transistor according to claim 1, further comprising an antiferromagnetic layer on at least one of the first and second ferromagnetic layers.

9. The transistor according to claim 1, further comprising:
a nonmagnetic layer located on one of the first and second ferromagnetic layers; and
a third ferromagnetic layer located on the nonmagnetic layer.

10. The transistor according to claim 9, wherein
magnetization of one of the first and second ferromagnetic layers is variable while magnetization of the other one of the first and second ferromagnetic layers is fixed,
magnetization of the third ferromagnetic layer is fixed, and
the magnetization direction of the other one of the first and second ferromagnetic layers, and the magnetization direction of the third ferromagnetic layer are substantially antiparallel.

11. A spin transistor comprising:
a lower electrode;
a film stack located on the lower electrode, the film stack including a first ferromagnetic layer, a first semiconductor layer, an i-layer, a second semiconductor layer, and a second ferromagnetic layer, the first semiconductor layer being one of an $n^+$-layer and a $p^+$-layer, the second semiconductor layer being the other one of the $n^+$-layer and the $p^+$-layer;
an upper electrode located on the film stack;
a gate insulating film located at a side portion of the film stack, the gate insulating film covering at least a side surface of the i-layer; and
a gate electrode located on the opposite side of the gate insulating film from the film stack.

12. The transistor according to claim 11, wherein the first ferromagnetic layer has a Fermi level at a higher energy level than a center of a minority spin band gap.

13. The transistor according to claim 11, wherein the second ferromagnetic layer has a Fermi level at a lower energy level than a center of a minority spin band gap.

14. The transistor according to claim 11, wherein the $p^+$-layer includes a semiconductor having a valence band maximum in the vicinity of a $\Gamma$ point.

15. The transistor according to claim 11, wherein the $n^+$-layer includes a semiconductor having a conduction band minimum in the vicinity of a $\Gamma$ point.

16. The transistor according to claim 11, wherein, when the i-layer is made of Si, a field intensity in the i-layer is lower than $3\times10^5$ V/cm, and, when the i-layer is made of GaAs, the field intensity in the i-layer is lower than $3\times10^4$ V/cm.

17. The transistor according to claim 11, further comprising a tunnel barrier layer provided at least one of between the first ferromagnetic layer and the first semiconductor layer, and between the second ferromagnetic layer and the second semiconductor layer.

18. The transistor according to claim 11, wherein
magnetization of one of the first and second ferromagnetic layers is variable while magnetization of the other one of the first and second ferromagnetic layers is fixed.

19. A memory comprising a memory cell including the spin transistor according to claim 1 as a storage element.

20. A memory comprising a memory cell including the spin transistor according to claim 11 as a storage element.

\* \* \* \* \*